US006622297B2

(12) United States Patent
Uno et al.

(10) Patent No.: US 6,622,297 B2
(45) Date of Patent: Sep. 16, 2003

(54) PATTERN CORRECTING METHOD AND PATTERN VERIFYING METHOD

(75) Inventors: Taiga Uno, Numazu (JP); Kazuko Yamamoto, Minato-ku (JP); Sachiko Kobayashi, Ichikawa (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 09/956,987

(22) Filed: Sep. 21, 2001

(65) Prior Publication Data

US 2002/0040468 A1 Apr. 4, 2002

(30) Foreign Application Priority Data

Sep. 29, 2000 (JP) ........................................ 2000-301305

(51) Int. Cl.[7] .............................................. G06F 17/50
(52) U.S. Cl. ............................................ 716/21; 716/19
(58) Field of Search ........................................ 716/1–21

(56) References Cited

U.S. PATENT DOCUMENTS 5,253,182 A * 10/1993 Suzuki ......................... 716/21
5,307,184 A * 4/1994 Nishiwaki et al. ............. 359/30
6,223,327 B1 * 4/2001 Yamaji ........................... 716/5

FOREIGN PATENT DOCUMENTS

JP       02000241959 A  *  9/2000  ......... H01L/21/027

OTHER PUBLICATIONS

Eytan Barouch, et al., "Optimask: An OPC Algorithm for Chrome and Phase–Shift Mask Design", SPIE vol. 2440, pp. 192–206, 1995.

* cited by examiner

*Primary Examiner*—Matthew Smith
*Assistant Examiner*—Sun James Lin
(74) *Attorney, Agent, or Firm*—Oblon, Spivak, McClelland, Maier & Neustadt, P.C.

(57) ABSTRACT

A pattern of exposure mask-use design data having a hierarchical structure is corrected in order to finish with fidelity a transfer pattern to be formed on a wafer, in which if the exposure apparatus has a light source shape that does not have rotation symmetry at any given angle around an optical axis, as the center, of an illumination optics or a projection optics, a cell A rotated in arrangement in input data having a hierarchical structure is replaced with a cell A' not employing rotation and then optical proximity correction is effected.

14 Claims, 5 Drawing Sheets

PATTERN CORRECTING METHOD AND PATTERN VERIFYING METHOD

CROSS-REFERENCE TO RELATED APPLICATIONS

This application is based upon and claims the benefit of priority from the prior Japanese Patent Application No. 2000-301305, filed Sep. 29, 2000, the entire contents of which are incorporated herein by reference.

BACKGROUND OF THE INVENTION

1. Field of the Invention

The present invention relates to a technology for designing a photo-mask used in manufacturing of semiconductors and, more particularly to, a pattern correcting method and a pattern verifying method for compensating the optical proximity effect.

2. Description of the Related Art

Conventionally, such a technology for compensating the optical proximity effect is known as disclosed in "OPTI-MASK: An OPC Algorithm for Chrome and Phase-Shifting Mask Design" by Eytan Barouch et al. in a literature Proc. SPIE-Int. Soc. Opt. Eng (USA) vol. 2440, pp. 192–206 (1995). In this literature, such an automatic optical proximity effect correcting method is discussed as comprising the steps of performing exposure simulation on a design pattern, subsequently extracting an edge portion (hereinafter called error edge) where a difference between the simulation image and a design pattern is larger than a prescribed threshold value, and moving the error edge by as much as a correction value calculated on the basis of the simulation to thereby correct the proximity effect.

In illumination of a shape that has no rotation symmetry at any given angle around an optical axis, as the center, of an illumination optics or a projection optics, there occurs a problem that a symmetrical pattern cannot be transferred onto the wafer symmetrically. Moreover, there are many cases where data having a hierarchical structure may have a cell which is arranged with setting of a conversion parameter such as a rotational arrangement or mirroring parameter. In such a case, if a hierarchical operation is simply used to perform Optical Proximity Correction (OPC) or transfer simulation under the above-mentioned illumination conditions, no rotation or mirroring is taken into account, so that a direction as viewed on an actual mask may not agree with a correcting direction. In this case, no correct OPC or transfer simulation can be performed, so that a mask created as a result may greatly decrease the wafer production yield.

Furthermore, the above-mentioned literature can be applied to the flat design data having no hierarchical structure, because the flat design data need not take directional dependency into account. About the design having a hierarchical structure, however, no description of a hierarchical operation is mentioned in the literature, so that it is not assured whether correction is possible, or whether proper correction is possible in any given direction on the surface of a wafer.

Thus, in such a case where a symmetrical pattern cannot be transferred symmetrically as in a case of employing illumination with a shape having no rotational symmetry at any given angle around an optical axis, as the center, of an illumination optics or a projection optics, OPC or transfer simulation is impossible with data having a hierarchical structure, thus resulting in a problem of a decrease in the yield of semiconductor manufacturing.

In view of the above, there is a need to provide a pattern correcting method and a pattern verifying method that can perform pattern correction or simulation accurately on data having a hierarchical structure even in a case where such an exposure apparatus is used that have different transfer properties with different directions in which mask patterns are arranged, thus contributing to an improvement in the yield of semiconductor manufacturing.

BRIEF SUMMARY OF THE INVENTION

The pattern correcting method according to a first aspect of the present invention, using an exposure apparatus which has a different transfer property in accordance with a mask pattern arranging direction in a lithography process, comprising:

preparing a design pattern data;

discriminating whether the pattern data of a designed pattern layout has a hierarchical structure including a reference cell or not;

discriminating whether a cell or a pattern in the reference cell has a designation of rotation or mirroring with respect to an x axis or a y axis orthogonal to the x axis or not, when the reference cell is included;

registering a cell or a pattern data after the rotation or the mirroring is effected as a new cell or a new pattern, when the rotation or the mirroring is designated;

replacing the cell or the pattern having the designation of the rotation or the mirroring to the new cell or the new pattern; and performing correction with the pattern data after the replacing.

The pattern verifying method according to a second aspect of the present invention, using an exposure apparatus which has a different transfer property in accordance with a mask pattern arranging direction in a lithography process, comprising:

preparing a pattern data of a designed pattern layout;

discriminating whether the pattern data has a hierarchical structure including a reference cell or not;

discriminating whether a cell or a pattern in the reference cell has a designation of rotation or mirroring with respect to an x axis or a y axis orthogonal to the x axis or not, when the reference cell is included;

registering a cell or a pattern data after the rotation or the mirroring is effected as a new cell or a new pattern, when the rotation or the mirroring is designated;

replacing the cell or the pattern having the designation of the rotation or the mirroring with the new cell or the new pattern;

simulating a transfer pattern to be formed on a wafer; and comparing simulated data to the pattern data.

The pattern correcting system according to a third aspect of the present invention, using an exposure apparatus which has a different transfer property in accordance with a mask pattern arranging direction in a lithography process, comprising:

means for discriminating whether a pattern data has a hierarchical structure including a reference cell or not, the pattern data being based on a desired pattern layout;

means for discriminating whether a cell or a pattern in the reference cell has a designation of rotation or mirroring with respect to an x axis or a y axis orthogonal to the x axis or not, when the reference cell is included;

means for registering a cell or a pattern data after the rotation or the mirroring is effected as a new cell or a new pattern, when the rotation or the mirroring is designated; and means for performing correction to the design pattern data based on the new cell or the new pattern.

Furthermore, the pattern verifying system according to a fourth aspect of the present invention, using an exposure apparatus which has a different transfer property in accordance with a mask pattern arranging direction in a lithography process, comprising:

means for discriminating whether a pattern data has a hierarchical structure including a reference cell or not, the pattern data being based on a desired pattern layout;

means for discriminating whether a cell or a pattern in the reference cell has a designation of rotation or mirroring with respect to an x axis or a y axis orthogonal to the x axis or not, when the reference cell is included;

means for registering a cell or a pattern data after the rotation or the mirroring is effected as a new cell or a new pattern, when the rotation or the mirroring is designated; and means for effecting transfer simulation to the pattern data based on the new cell or the new pattern.

DETAILED DESCRIPTION OF THE INVENTION

Figure 1:
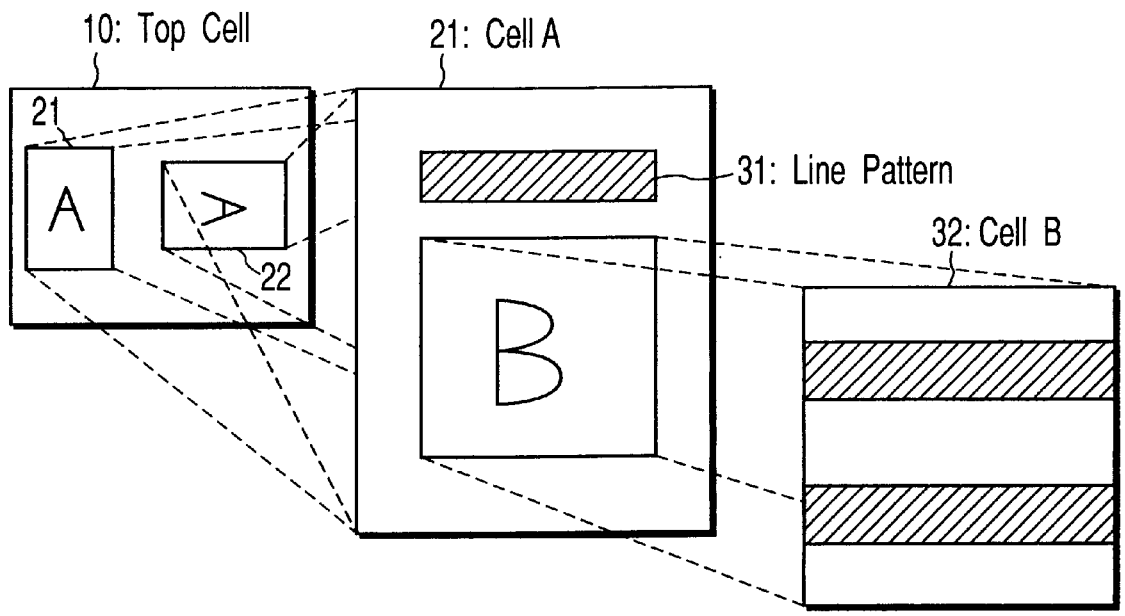
FIG. 1 is a schematic diagram for showing a cell layout configuration used in a first embodiment of the present invention.

Prior to the explanation of the embodiment, the background art and the feature of the embodiment will be first described as follows.

In a manufacturing process of an LSI, a circuit design is effected based on a product specification, followed by a layout design locating circuit elements and interconnections based on the circuit design. This layout design is converted to CAD data of a predetermined format.

The CAD data is converted to data for a mask writing system to make a photo-mask pattern. The photo-mask pattern is transferred on a semiconductor wafer by means of an exposure system. A hierarchical operation is sometimes utilized as one means to reduce the processing time required for the CAD data conversion to the mask writing system data.

The mask pattern design data for an LSI is configured by a combination of cells (blocks). In a cell, at least one of pattern data and reference information to another cell is provided. A hierarchical structure of design data means a hierarchical reference structure wherein a cell refers to another cell which refers to still another cell.

Such a hierarchical structure enables data amount reduction. More specifically, when an LSI chip includes a number of cells each pattern of which is defined as a basic pattern, the basic pattern data is defined in a cell only once, which is referred by other cells through the reference information provided in the other cells. A hierarchical operation is effected in a unit of a cell with the result that the number of the figures to be processed and the processing time are drastically reduced.

Note that pattern data for repetitive use are stored as basic cells in the CAD system. Further, formation of a desired circuit pattern utilizes rotation or mirroring of the basic pattern and a combination thereof.

There is provided so-called a flat operation wherein all of design data in a hierarchical structure are flatly developed and all figures are processed. This operation is suitable for processing of logic devices and the like, which include irregular patterns.

Incidentally, there is known so-called optical proximity effect wherein a dimension or a shape of a pattern to be formed are affected by an adjacent pattern in optical transfer. To reduce the optical transfer effect, it is known to change a pattern size according to surroundings patterns thereof, or to add an auxiliary pattern thereto. The method of correcting a pattern as described above is the optical proximity correction (OPC) aforementioned.

An OPC processing is easily effected when a specification of an exposure system to be used is previously known and a flat operation is effected. However, when an exposure system wherein a transfer property depends on an arranging direction of a pattern and mask pattern data has a hierarchical structure including rotation or mirroring, an actually manufactured pattern is sometimes different from the designed pattern, as the rotation or mirroring is not considered at the OPC processing or transfer simulation. Note that the transfer simulation is to simulate an actual pattern to be manufactured according to a mask design by means of computing.

According to one aspect of the present invention, even in a case where an exposure apparatus (system) is employed which has a different transfer property in accordance with a mask pattern arranging direction, it is possible, in correction of the optical proximity effect on a design pattern, to correct a cell rotated or mirrored in arrangement in input data having a hierarchical structure regardless of the mask pattern arranging direction. This is achieved actually by replacing such a cell as described above with a cell or pattern not employing rotation or mirroring and then correcting it, without involving rotation or mirroring during the hierarchical operation.

Furthermore, according to another aspect of the present invention, even in a case where an exposure apparatus is used which has a different transfer property in accordance with a mask pattern arranging direction, pattern verification by use of transfer simulation does not involve rotation or mirroring during the hierarchical operation on a cell rotated or mirrored in arrangement in input data having a hierarchical structure. This is achieved by replacing such a cell as described above with a cell or pattern not employing rotation or mirroring and then performing transfer simulation on it. This enables transfer simulation regardless of the mask pattern arranging direction, thus verifying the pattern properly.

Furthermore, under the conditions of using illumination of a shape of twice-rotation symmetry (corresponding to 180° rotation) instead of 4-times-rotation symmetry (corresponding to 90° rotation), such a cell alone that is rotated so as to exchange x-axis and y-axis with each other is replaced with a cell or pattern not employing rotation. This eliminates the need of conversion (replacement) processing in mirroring or rotation of such a degree of 180° or 360° that does not exchange the x-axis and y-axis with each other, thus enabling an effective conversion under those illumination conditions.

Thus, the present invention enables accurate correction and simulation on a pattern for data having a hierarchical structure to thereby contribute to an improvement in the semiconductor manufacturing yield even with a case where an exposure apparatus is used which has a different transfer property in accordance with a mask pattern arranging direction.

The followings are preconditions of the embodiments:
(1) Such an exposure apparatus is used that the shape of a light source thereof has no rotation symmetry at any given angle around an optical axis, as the center, of an illumination optics or a projection optics; and
(2) Such an exposure apparatus is used that the shape of a light source thereof is of twice rotation symmetry instead of 4-times rotation symmetry, under the conditions that such a cell alone that is rotated in such a manner as to exchange the x-axis and the y-axis with each other is converted to a cell or pattern not employing rotation.

The following will describe the embodiments of the present invention with reference to the drawings.

The present invention has two categories of two methods of correcting and verifying a design pattern having a difference therebetween of whether the final target is OPC or transfer simulation but employing the same procedure, so that these two targets are described below as summarized in an embodiment.

In these methods, which are effective in a case where an exposure apparatus is used which has a different transfer property in accordance with a mask pattern arranging direction, it is assumed to use such an exposure apparatus having different transfer properties that a shape of a light source thereof is out of (does not have) rotation symmetry at any given angle around an optical axis, as the center, of an illumination optics or a projection optics. These methods, however, are not restricted to a shape of a light source and may be applicable to a case where the transfer property is influenced by etching processes and rotation symmetry is not maintained.

As shown in FIG. 1, two cells A are arranged in a top cell 10; one cell (21) is arranged in an original direction and the other cell (22) is rotated by 270°. In this case, the original direction means the direction of a basic cell defined in the CAD data. The top cell is a high-end cell in a hierarchical structure, and corresponds to a final mask data in most cases.

Figure 2:
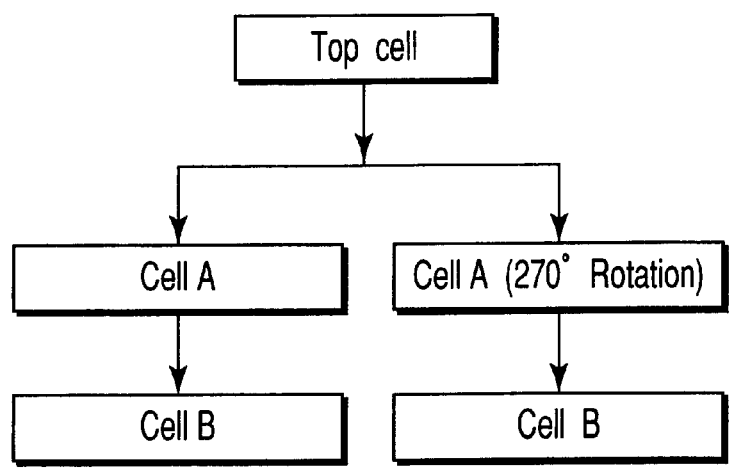
FIG. 2 is an illustration for showing a hierarchical structure of the layout used in the first embodiment.

Moreover, a cell A, which is referenced by the cells 21 and 22, has therein one line pattern 31 and a cell B indicated by number 32 as arranged in an original direction. This configuration is shown in FIG. 2 in a tree format. The required processing, although it comes variously, only needs to convert cells to such a state that they are arranged in a unified direction desired immediately before OPC or simulation, only one example of which is given by this embodiment.

This embodiment is described with a method by which, before OPC or transfer simulation, the input data is converted to data not accompanied by rotation or mirroring. By another method, for example, when OPC or transfer simulation is performed during the hierarchical operation, a subject is rotated or mirrored on a real time basis, actually immediately before OPC or simulation for each processing unit.

Furthermore, the present invention is not limited to replacement of a cell employing both of rotation and mirroring with a cell not employing them, and it may be applied to a method of replacing mirroring alone, leaving rotation as it is, or vice versa, or a method of replacement of a cell using rotation at a rotation angle except for a specific rotation angle. In short, the present invention can be applied to necessary replacement as required.

In a case of employing illumination of twice-rotation symmetry instead of 4-times-rotation symmetry, however, only a cell of such a rotation that comprises an operation of exchanging x and y values with each other, that is a rotation of $(\pi \times n + \pi/2)$ radian in angle (n: integer) needs to undergo such processing that rotates (converts) the contents thereof so as to provide a rotation of $\pi \times n$ radian in angle, thus eliminating the need of performing such conversion processing that cancels mirroring in particular.

Further, in the case where illumination is employed which is of twice-rotation symmetry instead of 4-times-rotation symmetry, a cell of such a rotation that does not involve an operation of exchanging x and y values with each other, that is, a cell of $\pi \times n$ radian in angle may undergo such rotation processing as to provide $(\pi \times n + \pi/2)$ radian in angle. In this case, only the operation of exchanging x and y values with each other is performed, so that by rotating a relevant illumination shape so as to exchange the x-axis and the y-axis with each other in processing, OPC or transfer simulation can be performed in a proper direction. Moreover, the illumination shape is not limited to the above-mentioned one, so that proper OPC or transfer simulation is possible by performing rotation or mirroring on a cell or pattern such that the direction of the illumination shape may agree with that of a transfer pattern.

Figure 3:
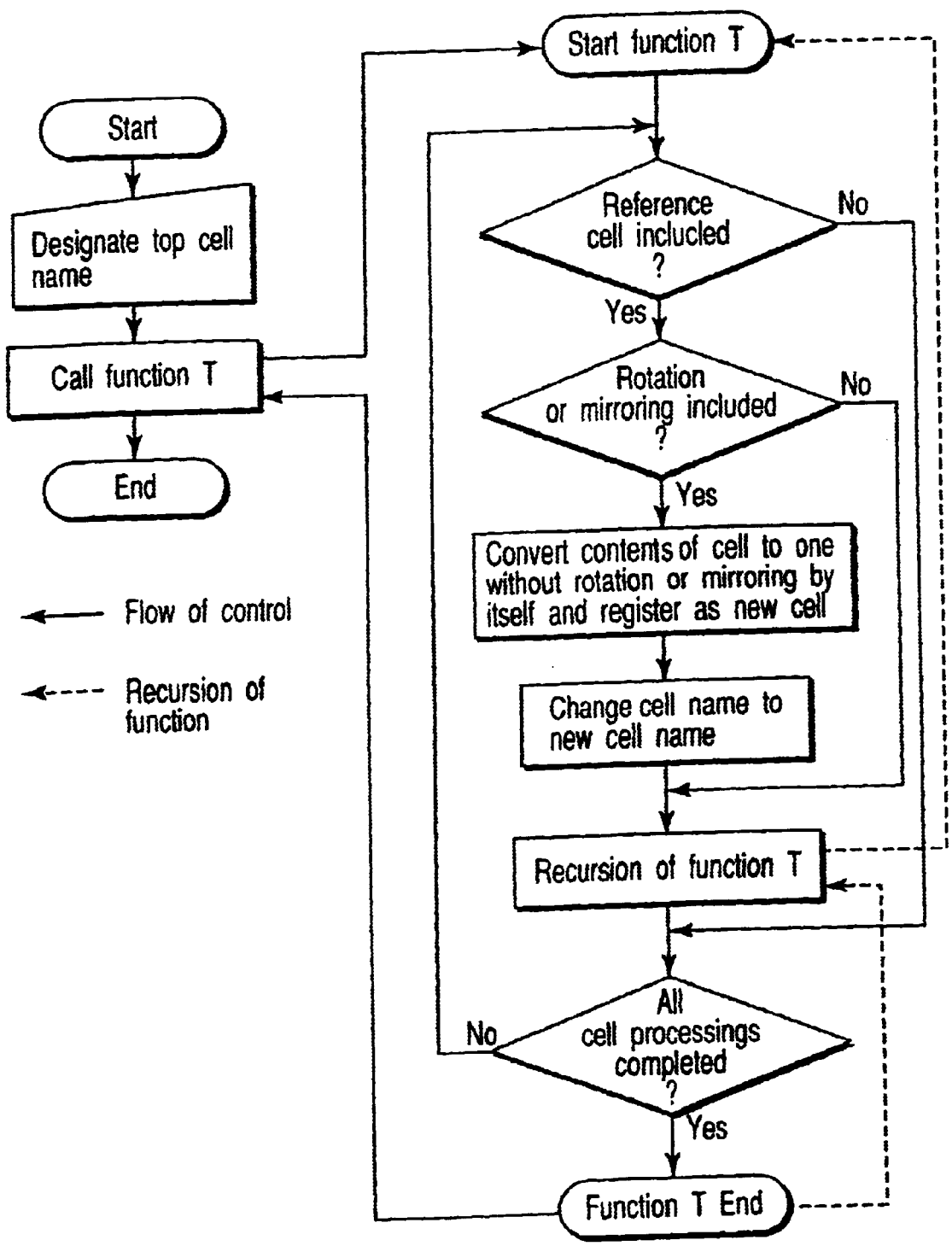
FIG. 3 is a flowchart for showing processing of FIG. 1.

A flowchart for processing of canceling rotation or mirroring on the input data to thereby create new data is shown in FIG. 3. When a top cell name is given first, cells to be referred in a top-down sequence starting from the designated top cell are pursued to call by a recursive call function T which performs conversion such as rotation or mirroring described below in processing.

First, a cell to be processed currently is decided on whether it has reference cells, which are to be extracted one by one. Each of thus extracted cells is decided on whether it has been rotated or mirrored in arrangement, so that such a cell that has an addition of conversion data of rotation or mirroring undergoes conversion for canceling such processing as rotation or mirroring. Actually, by arranging a pattern in a cell to be referenced without performing rotation or mirroring thereon, a new cell is created. The processing registers the newly created cell, that is, a pattern or a cell wherein rotation or mirroring is cancelled, and an cell of interest is re-linked to the above-mentioned newly created cell.

This processing is specifically described with reference to figures: a top cell 10 shown in FIGS. 1 and 2 has two cell of a cell A indicated by 21 not rotated or mirrored in arrangement and another cell A indicated by 22 rotated by 270° in arrangement.

As the first step, the processing on the cell A of number 21, which is not accompanied by rotation or mirroring, does not involve conversion at all and so shifts to the next step, recognizing the cell A as the top cell. This cell A has arranged therein one line pattern 31 and a cell B indicated by 32 not rotated or mirrored as viewed from the cell A. Further, although the cell B referred from the cell A is recognized as the top cell to make a shift to the next step, the cell B contains no cell to be referred and is terminated in processing at this point in time, thus returning to processing of the cell A. The cell contained in the cell A has already been finished in processing, thus returning to the processing of the top cell 10.

The top cell 10 has another cell A of number 22 rotated by 270° in arrangement, which cell A is now processed. Since this cell A of number 22 is rotated in arrangement, a pattern 31 contained in cell 22 and a cell B are rotated by 270 (or −90°) in conversion and saved in a new cell A'. This cell A' thus obtained by conversion is substituted for the rotated cell A to thereby cancel rotation. Then, this cell A' is recognized as the top cell to shift to the next step.

The cell B contained in the original cell A is not rotated or mirrored but is arranged as rotated by 270° (or −90°) when the cell A of number 22 itself is rotated in conversion into the cell A' of number 22'. Therefore, the cell B is rotated in conversion by 270° (or −90°) to create a cell B', to which the cell of interest is re-linked from the cell B.

Figure 4:
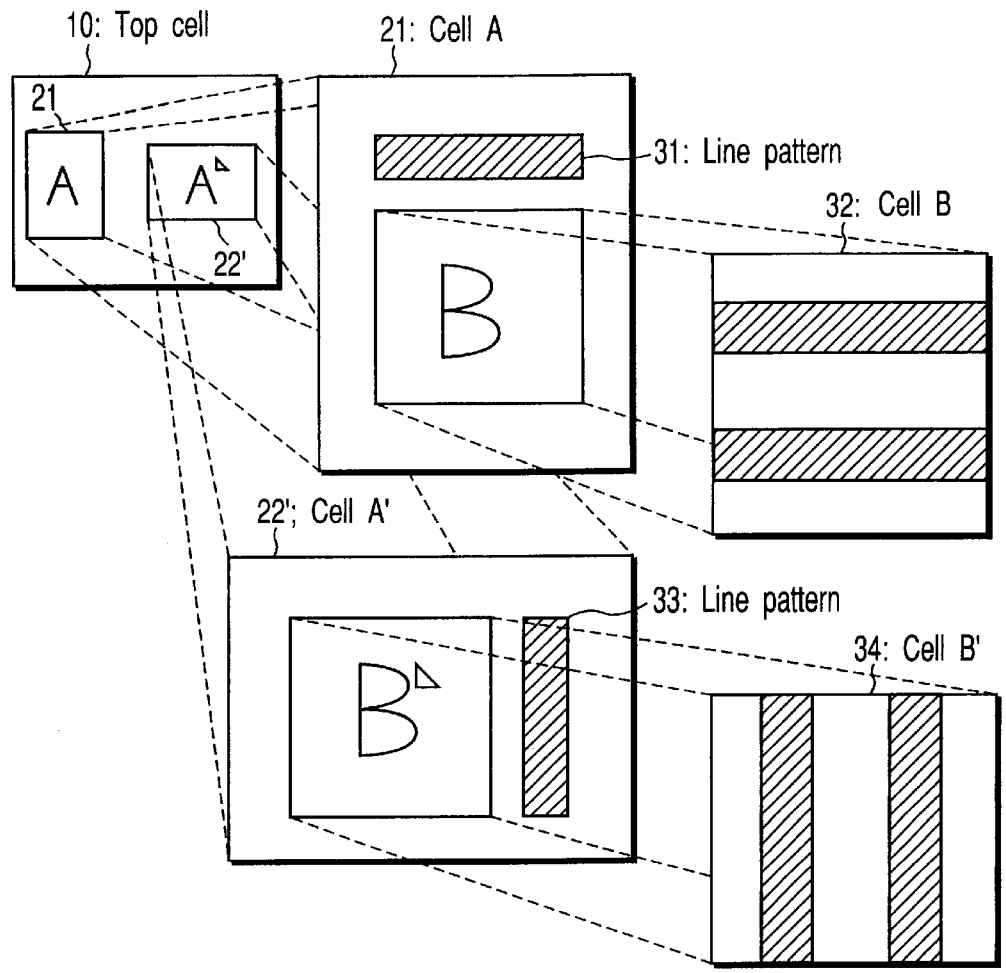
FIG. 4 is a schematic diagram for showing the cell layout configuration after the processing of the first embodiment.
Figure 5:
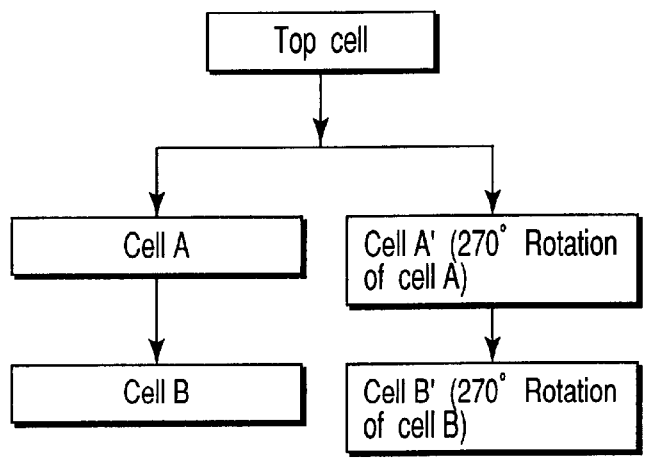
FIG. 5 is an illustration for showing the hierarchical structure of the layout after processing of the first embodiment.

The above-mentioned processing results in a cell structure shown in FIGS. 4 and 5. That is, the top cell 10 contains the cell A (21) arranged in the original direction and the new cell A' (22') obtained by rotating the pattern 31 and the cell B (32) by 270° in conversion. In the cell A (21) one line pattern 31 and the cell B (32) are arranged in the original direction. Arranged in the new cell A' (22') are one line pattern 33 and the new cell B' (34) obtained by rotating in conversion the cell B by 270° (or −90°).

The above processing completes pattern data having a new hierarchical structure from which the information of rotation or mirroring on cell arrangement has been cancelled. Finally, the data after the processing undergoes OPC or transfer simulation by the hierarchical operation.

Thus, by this embodiment, like in a case of illumination using a shape having no rotation symmetry at any given angle around an optical axis, as the center, of an illumination optics or a projection optics, it is possible to perform processing of optical proximity effect correction or transfer simulation by use of the hierarchical operation in a case where a symmetrical pattern cannot be transferred onto the wafer symmetrically, while taking full advantages of the hierarchical operation (higher speed processing and data amount reduction). This results in a great improvement in the semiconductor manufacturing yield.

Figure 6:
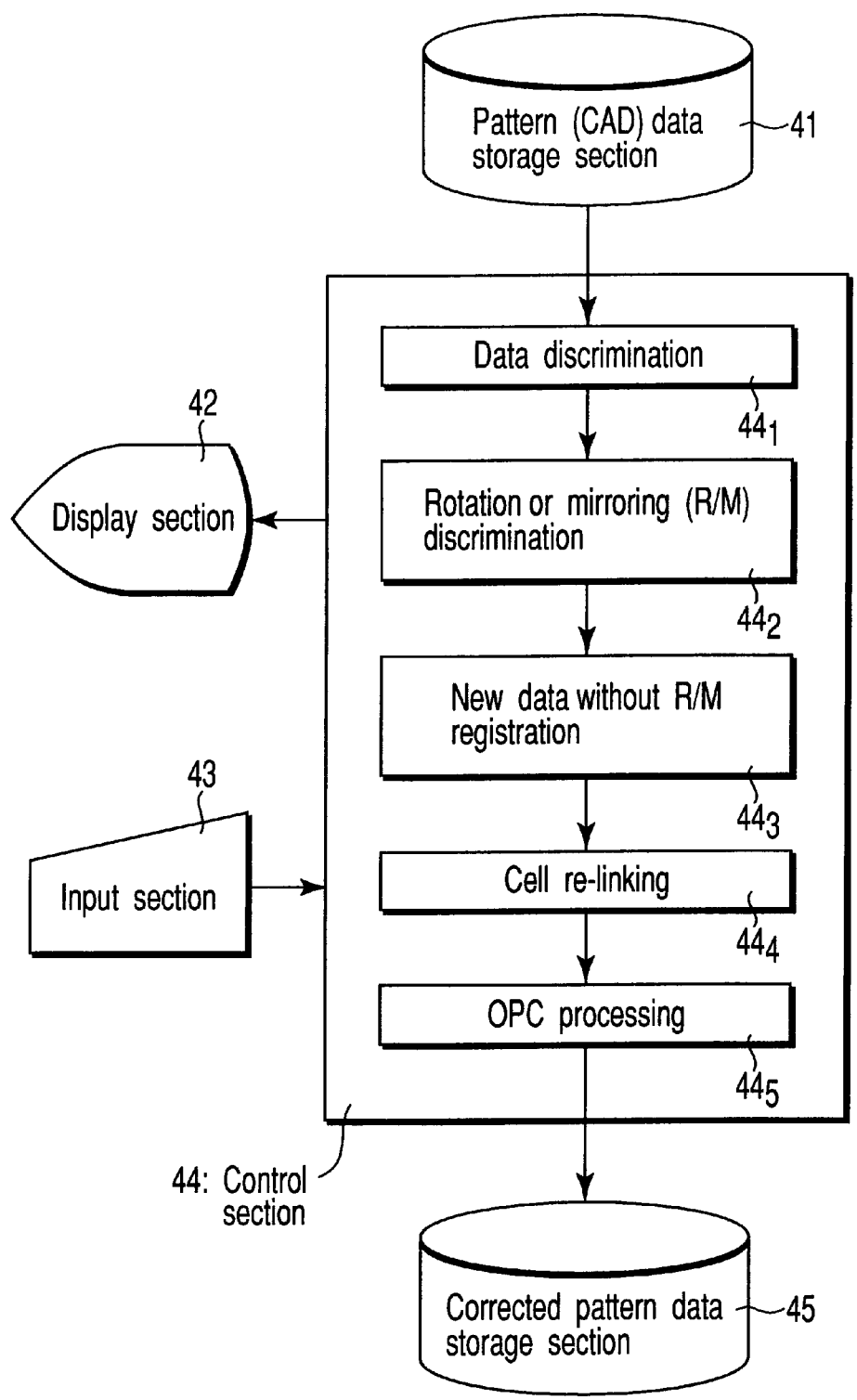
FIG. 6 is a block diagram of an OPC system used in the first embodiment.
Figure 7:
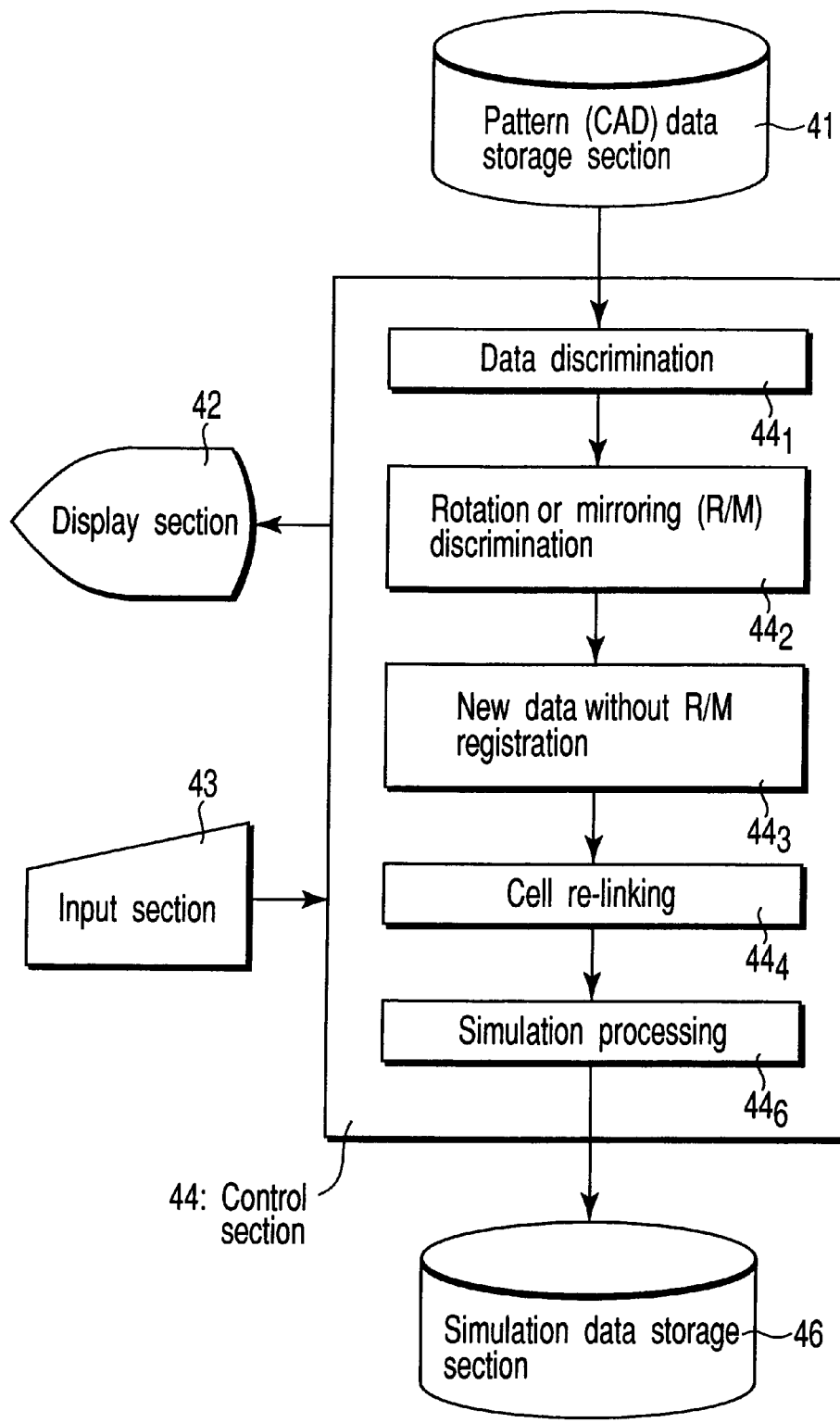
FIG. 7 is a block diagram of a transfer simulation system used in the first embodiment.

FIGS. 6 and 7 show schematic block diagrams of the systems configured for the above-mentioned OPC and transfer simulation, respectively. The systems comprise pattern (CAD) data storage section 41, display section 42, input section 43, control section 44, corrected pattern data storage section 45 or simulation data storage section 46.

Generally, a computer such as EWS (engineering work station) is used for control section 44. The program for the computer provides data discrimination $44_1$, rotation or mirroring (R/M) discrimination $44_2$, new data without R/M registration $44_3$, cell re-linking $44_4$, OPC processing $44_5$ or simulation processing $44_6$.

As detailed above, even in a case where such an exposure apparatus is used that has a different transfer property in accordance with a mask pattern arranging direction in a photolithography process when a pattern is to be corrected or verified, it is possible to perform the processing of optical proximity effect correction or transfer simulation by use of the hierarchical operation in a proper direction. That is, even on such data that has a hierarchical structure, the processing of pattern correction or simulation can be performed accurately, while taking full advantages of the hierarchical processing (higher speed processing and data amount reduction), thus contributing to an improvement in the semiconductor manufacturing yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern correcting method, comprising:
    preparing a pattern data of a designed pattern layout, the designed pattern layout being prepared in accordance with an exposure apparatus having a different transfer property in accordance with a mask pattern arranging direction in a lithography process;
    discriminating whether the pattern data has a hierarchical structure including a reference cell;
    discriminating whether a cell or a pattern in the reference cell has a designation of rotation or mirroring with respect to an x axis, or a y axis orthogonal to the x axis, when the reference cell is included;
    registering the cell or the pattern after the rotation or the mirroring is effected as a new cell or a new pattern, respectively, when the rotation or the mirroring is designated;
    replacing the cell or the pattern having the designation of the rotation or the mirroring with the new cell or the new pattern, respectively; and
    performing correction to the pattern data after the replacing step.

2. The pattern correcting method according to claim 1, wherein the exposure apparatus uses such a light source that is out of rotation symmetry at any given angle around an optical axis, as the center, of an illumination optics or a projection optics.

3. The pattern correcting method according to claim 1, wherein, when the exposure apparatus uses such a light source that has a shape of twice-rotation symmetry instead of 4-times-rotation symmetry, the discriminating of whether a cell or a pattern in the reference cell has a designation of rotation or mirroring with respect to an x axis or a y axis orthogonal to the x axis or not includes discriminating whether the cell or the pattern in the reference cell has a designation of rotation exchanging the x axis and the y axis with each other, and
    the registering of a pattern data as a new pattern data includes registering a pattern data after the rotation exchanging the x axis and the y axis with each other is effected as a new pattern data, when the designation of rotation exchanging the x axis and the y axis exists.

4. A pattern verifying method, comprising:
    preparing a pattern data of a designed pattern layout, the designed pattern layout being prepared in accordance with an exposure apparatus having a different transfer property in accordance with a mask pattern arranging direction in a lithography process;
    discriminating whether the pattern data has a hierarchical structure including a reference cell;
    discriminating whether a cell or a pattern in the reference cell has a designation of rotation or mirroring with respect to an x axis, or a y axis orthogonal to the x axis, when the reference cell is included;
    registering the cell or the pattern after the rotation or the mirroring is effected as a new cell or a new pattern, respectively, when the rotation or the mirroring is designated;

replacing the cell or the pattern having the designation of the rotation or the mirroring with the new cell or the new Patter respectively;

simulating a transfer pattern to be formed on a wafer; and comparing simulated data to, the pattern data.

5. The pattern verifying method according to claim 4, wherein the exposure apparatus uses such a light source that is out of rotation symmetry at any given angle around an optical axis, as the center, of an illumination optics or a projection optics.

6. The pattern verifying method according to claim 4, wherein, when the exposure apparatus uses such a light source that has a shape of twice-rotation symmetry instead of 4-times-rotation symmetry, the discriminating of whether a cell or a pattern in the reference cell has a designation of rotation or mirroring with respect to an x axis or a y axis orthogonal to the x axis or not includes discriminating whether the cell or the pattern in the reference cell has a designation of rotation exchanging the x axis and the y axis with each other, and the registering of a pattern data as a new pattern data includes registering a pattern data after the rotation exchanging the x axis and the y axis with each other is effected as a new pattern data, when the designation of rotation exchanging the x axis and the y axis with each other exists.

7. A pattern correcting system, comprising:

means for discriminating whether a pattern data has a hierarchical structure including a reference cell, the pattern data being based on a designed pattern layout prepared in accordance with an exposure apparatus having a different transfer property in accordance with a mask pattern arranging direction in a lithography process;

means for discriminating whether a cell or a pattern in the reference cell has a designation of rotation or mirroring with respect to an x axis, or a y axis orthogonal to the x axis, when the reference cell is included;

means for registering the cell or the pattern after the rotation or the mirroring is effected as a new cell or a new pattern, respectively, when the rotation or the mirroring is designated; and means for performing correction to the pattern data based on the new cell or the new pattern.

8. The pattern correcting system according to claim 7, wherein the exposure apparatus uses such a light source that is out of rotation symmetry at any given angle around an optical axis, as the center, of an illumination optics or a projection optics.

9. The pattern correcting system according to claim 7, wherein the exposure apparatus uses such a light source that has a shape of twice-rotation symmetry instead of 4-times-rotation symmetry, the means for discriminating whether a cell or a pattern in the reference cell has a designation of rotation or mirroring with respect to an x axis or a y axis orthogonal to the x axis or not discriminates merely whether the cell or the pattern in the reference cell has a designation of rotation exchanging the x axis and the y axis with each other.

10. A patter verifying system, comprising:

means for discriminating Whether a pattern data has a hierarchical structure including a reference cell, the pattern data being based on a designed pattern layout which is prepared in accordance with an exposure apparatus having a different transfer property in accordance with a mask pattern arranging direction in a lithography process;

means for discriminating Whether a cell or a pattern in the reference cell has a designation of rotation or mirroring with respect to an x axis, or a y axis orthogonal to the x axis, when the reference cell is included;

means for registering the cell or the pattern after the rotation or the mirroring is effected as a new cell or a new pattern, respectively, when the rotation or the mirroring is designated; and means for effecting transfer simulation to the pattern data based on the new cell or the new pattern.

11. The pattern verifying system according to claim 10, wherein the exposure apparatus uses such a light source that is out of rotation symmetry at any given angle around an optical axis, as the center, of an illumination optics or a projection optics.

12. The pattern verifying system according to claim 10, wherein the exposure apparatus uses such a light source that has a shape of twice-rotation symmetry instead of 4-times-rotation symmetry, the means for discriminating whether a cell or a pattern in the reference cell has a designation of rotation or mirroring with respect to an x axis or a y axis orthogonal to the x axis or not discriminates merely whether the cell or the pattern in the reference cell has a designation of rotation exchanging the x axis and the y axis with each other.

13. A pattern correcting system, comprising:

a first data discrimination portion discriminating whether a pattern data has a hierarchical structure including reference cell, the pattern data being based on a designed pattern layout prepared in accordance with an exposure apparatus having a different transfer property in accordance with a mask pattern arranging direction in a lithography process;

a second data discrimination portion discriminating whether a cell or a pattern in the reference cell has a designation of rotation or mirroring with respect to an x axis, or a y axis orthogonal to the x axis, when the reference cell is included;

a storage portion registering the cell or the pattern after the rotation or the mirroring is effected as a new cell or a new pattern, respectively, when the rotation or the mirroring is designated; and a correcting portion performing correction to the pattern data based on the new cell or the new pattern.

14. A pattern verifying system, comprising:

a first data discrimination portion discriminating whether a pattern data has a hierarchical structure including a reference cell, the pattern data being based on a designed pattern layout prepared in accordance with an exposure apparatus having a different transfer property in accordance with a mask pattern arranging direction in a lithography process;

a second data discrimination portion discriminating whether a cell or a pattern in the reference cell has a designation of rotation or mirroring with respect to an x axis, or a y axis orthogonal to the x axis, when the reference cell is included;

a storage portion registering the cell or the pattern after the rotation or the mirroring is effected as a new cell or a new pattern, respectively, when the rotation or the mirroring is designated; and a simulation portion performing a transfer simulation to the pattern data based on the new cell or the new pattern.

* * * * *